United States Patent [19]

Hamel

[11] Patent Number: 4,987,366

[45] Date of Patent: Jan. 22, 1991

[54] OSCILLATOR DAMPED TEST AND EVALUATION CIRCUIT FOR A PROXIMITY SWITCH

[75] Inventor: Manfred Hamel, Rhauderfehn, Fed. Rep. of Germany

[73] Assignee: Siemens Aktiengesellschaft, Fed. Rep. of Germany

[21] Appl. No.: 248,635

[22] Filed: Sep. 23, 1988

[30] Foreign Application Priority Data

Sep. 24, 1987 [DE] Fed. Rep. of Germany ....... 3732211

[51] Int. Cl.$^5$ .................. G01B 7/14; G01N 27/00; H01H 35/00; H01H 63/00
[52] U.S. Cl. ...................... 324/207.26; 324/207.12; 331/65; 307/116
[58] Field of Search ............. 324/202, 207.11, 207.12, 324/207.13, 207.15, 207.16, 207.26, 236; 331/65, 117 B, 167; 246/249; 361/179, 180; 307/116

[56] References Cited

U.S. PATENT DOCUMENTS

| 4,327,433 | 5/1982 | Nodera et al. ............... 307/311 |
| 4,433,309 | 2/1984 | Hermle et al. ................ 331/65 |
| 4,492,925 | 1/1985 | Kammerer et al. ......... 324/418 |
| 4,866,377 | 9/1989 | Macouschi ................... 324/202 |

FOREIGN PATENT DOCUMENTS

| 1513058 | 9/1970 | Fed. Rep. of Germany . |
| 3150212 | 2/1983 | Fed. Rep. of Germany . |
| 3342710 | 1/1985 | Fed. Rep. of Germany . |
| 3440027 | 5/1986 | Fed. Rep. of Germany . |

Primary Examiner—Walter E. Snow
Attorney, Agent, or Firm—Kenyon & Kenyon

[57] ABSTRACT

A proximity switch having a test and an evaluation circuit contains a control circuit for generating pulses, an oscillator, a periodically activated damping circuit for the oscillator and a relay circuit. The test circuit, with the damping circuit and a control circuit, generates a pulse sequence required for the active testing only so long as the proximity switch is not damped by an outside element. The evaluation circuit carries a response current only as long as the test circuit also actively tests in its faultless condition.

5 Claims, 2 Drawing Sheets

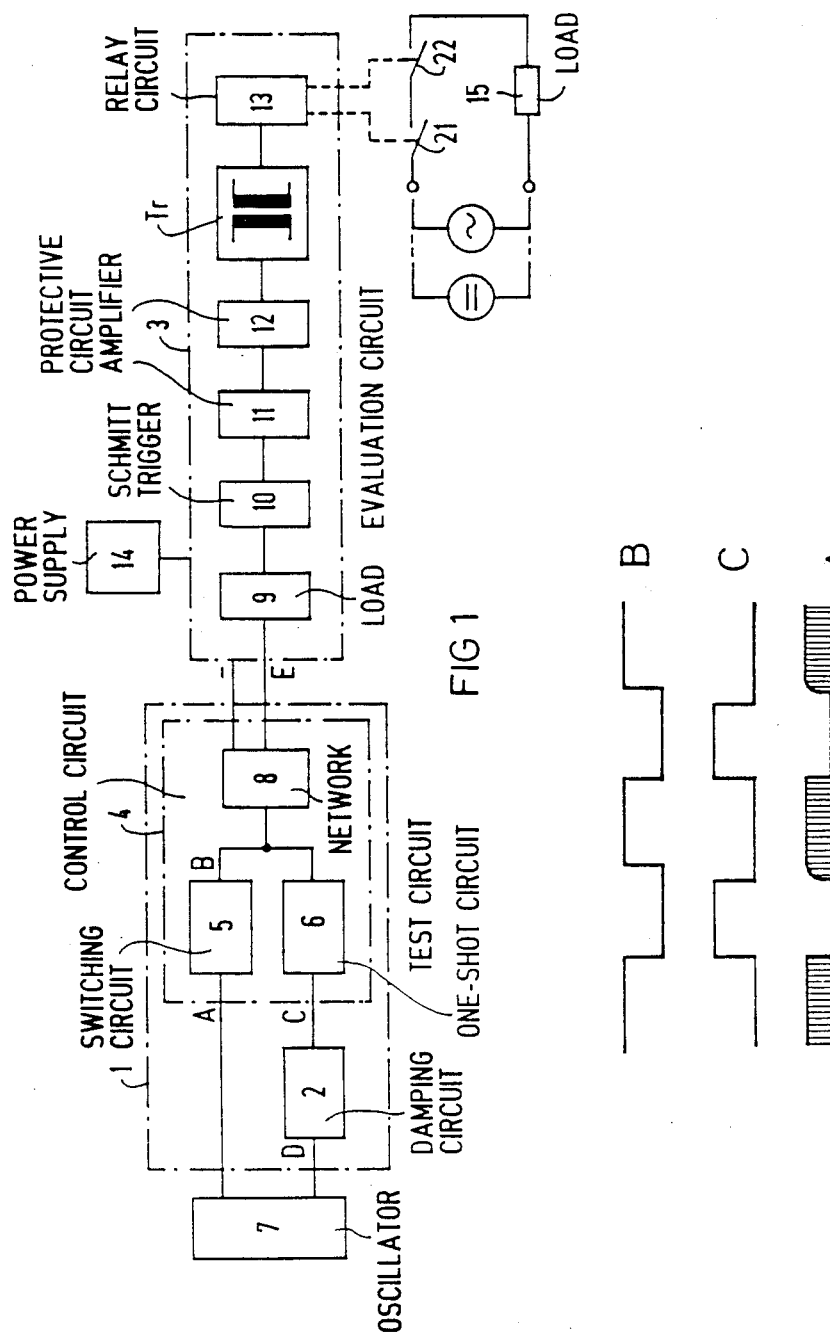

OSCILLATOR DAMPED TEST AND EVALUATION CIRCUIT FOR A PROXIMITY SWITCH

FIELD OF THE INVENTION

This invention relates to proximity switches in general and more particularly to an improved proximity switch of the type having a test and evaluation circuit, a control circuit for generating pulses, an oscillator, a damping circuit for the oscillator which becomes active periodically and a relay circuit.

BACKGROUND OF THE INVENTION

A test and evaluation circuit of the above-mentioned kind is described in European Patent No. 0 060 992. Proximity sensing occurs when an external actuating element comes in proximity to the oscillator causing its oscillations to be damped. In the disclosed circuit, a test and evaluation circuit for determining the proper functioning of the proximity switch, which is provided as an element of a machine control, is described. The proximity switch can be switched between its two switching states, both when its oscillator is damped and undamped, by means of a control circuit. Thereby, a clocked output signal is generated at the output of the proximity switch, which signal is fed to an evaluation circuit connected to the proximity switch. As long as there is a clocked output signal, an enable signal is given by the proximity switch via its relay circuit monitoring the machine control. If the clocked output signal fails to arrive however, a blocking signal for the machine control is generated. In the control circuit of the proximity switch described therein, a square wave signal is generated continuously by means of an astable multivibrator. If the proximity switch is damped for an extended period of time by an external actuating element, thermal overload protection is required in order to protect electronic switching elements in the evaluation circuit. In addition, in the externally damped state of the proximity switch, its evaluation circuit is stressed by current. This current stress is of particular concern to the switching transistors as well as the primary side of a transformer located at the input of the relay circuit. The relay circuit contains two relays which are switched one after the other and are located in different current paths.

West German patent No. DE 33 42 710 discloses an inductive proximity switch with an RF oscillator stage, a switching stage, an amplifier stage and an output stage. Electric energy is fed to the proximity switch at its two terminal points through an evaluation unit. By means of a bridge rectifier which is inserted between the terminal points and the circuit components, the proximity switch can be operated independently of the polarity of the circuit supplying signal current. If the oscillator is damped externally, it is possible to provide a damping reduction of the oscillator by reversing the polarity of the signal current circuit, which, if the circuit components operate properly, results in a corresponding signal change at the output of the proximity switch. Similarly a functional test can be carried out by means of reversing the polarity of the signal current circuit if the oscillator is not damped externally. This leads to internal damping of the oscillator. For switching between interrogation operation which represents the normal current state, and test operation, certain requirements as to a supply, evaluation and monitoring circuit must be met. Such a circuit must make available the supply voltage. It must also carry out the periodic polarity reversal of the supply voltage in accordance with a pulse sequence. This pulse sequence which is used for the switching reversal, however, is generated by the evaluation and monitoring circuit.

Finally, a circuit arrangement for an inductive proximity switch is known from West German Patent No. DE 31 50 212, by means of which the functioning of the proximity switch can be checked regardless of the actual operating condition of the oscillator. The proximity switch comprises a high-frequency oscillator, a subsequent amplifier and a testing device with a test terminal. By addressing the test terminal with a test signal triggered via a push button, the oscillator, if not damped from the outside, can be damped, and, if damped, the oscillator can be relieved of damping. This reversal of the instantaneous oscillator state caused internally to the circuit by means of the push button causes a change of the output signal present at the proximity switch. Its evaluation provides information regarding the availability of the proximity switch. The function of the push button can be taken over by a circuit stage which responds automatically.

There is a need, however, to provide a test and evaluation circuit for a proximity switch which is improved over the aforementioned prior art, particularly of the type disclosed in European Patent No. 0 060 992, by means of which trouble-free operation of the proximity switch itself, and of the elements of the test and evaluation circuit, is monitored, whereby the reliability of the test and evaluation circuit and thereby, also the availability of the proximity switch is increased.

SUMMARY OF THE INVENTION

In a proximity switch test and evaluation circuit which includes a control circuit for generating pulses, an oscillator, a damping circuit for the oscillator and a relay circuit, this need is met by having a test circuit with a damping circuit generate the pulse sequence required for the active testing only when the proximity switch is not damped by an external activation element and by having the evaluation circuit carry a response current only when the test circuit also tests actively in its faultless state. The control circuit comprises an integrated switching circuit associated with the proximity switch and a one-shot circuit, connected to one of its outputs. The one-shot circuit contains two series connected one-shot multivibrators. The integrated switching circuit has its input connected to the oscillator. The damping circuit is disposed between the output of the one-shot circuit and the oscillator. A network is connected to the junction between the integrated switching circuit and the one-shot circuit. Such a control circuit is distinguished by simple and readily available circuit components.

It is further found advantageous if the control circuit provides a pulse sequence at the output of the integrated switching circuit which is converted, in the network, into corresponding state changes for the evaluation circuit. The pulse sequence is formed by means of the integrated switching circuit associated with the proximity switch in a closed loop which also includes the one-shot circuit, the damping circuit and the oscillator. Therefrom results self-monitoring for these components since these allow the generation of a pulse sequence only in a fault free stage. Contrary to the usual application, the circuit can also be operated with inverted logic. This means that the possibility of generating the pulse sequence in the presence of an actuating element exists with the present circuit. In this case, the oscillator is operated with a small wave amplitude which is increased to a value required for generating pulses at the input of the integrated switching circuit only upon the approach of an actuating element of ferromagnetic material.

The evaluation circuit has two terminals which are connected to outputs of the network of the test circuit, where the first terminal is connected to a load and the second terminal to the minus pole of a d-c voltage which is generated by a power supply and supplies the evaluation circuit. At the load, the change of state at the output of the network is changed into a square wave voltage advantageous for the evaluation. The load is, in the sequence given, coupled to a Schmitt trigger, a protective circuit against short circuits, an amplifier circuit, a transformer and a relay circuit. The relay circuit is connected via an output of the evaluation circuit to the load circuit which is to be controlled by the proximity switch. The advantage of the circuit is the design with simple and reliable circuit components. The Schmitt trigger also forms an accurately defined voltage level at its output from a distorted signal. This turns out to be advantageous for reliable and trouble-free operation of the subsequent parts of the circuit. If, however, the signal is heavily distorted due to a circuit part preceding the Schmitt trigger, the latter does not respond and thus causes the transition of the proximity switch into the secure state, i.e., a state where the load associated with the proximity switch is not supplied with current.

The relay circuit comprises a rectifier bridge circuit with plus and minus poles at its output and which has its input connected to the secondary side of the transformer. At its output, between its plus and minus poles, a parallel smoothing choke, to which a series circuit consisting of a capacitor, a first ohmic resistor as well as two normally closed contacts of two automatically controlled relays are connected. The cathode of a Zener diode is connected to the plus pole and the junction point of the Zener diode and a third ohmic resistor to the control electrode of a thyristor, the cathode of which, as well as the third ohmic resistor, is connected with the terminal of the capacitor facing away from the plus pole. Between the plus pole and the anode of the thyristor, two relays are connected in series, parallel to which a diode is tied which is connected to the plus pole on the cathode side, where two series-connected normally open contacts are connected. Two further normally open contacts controlled by the relays are connected into the load circuit of the proximity switch.

The relay circuit is part of the improved evaluation circuit and has the following advantages: The two automatically controlled relays monitor themselves. In the case where the normally closed contact of one of the two relays remains closed in the currentless condition, the subsequent response of the other relay also due to an additional fault in the relay circuit, for instance, fusing the thyristor is precluded. With the relay circuit described, provision is also made for a reliable response of the relays which takes place via the stored energy of the capacitor located in the series circuit and which is initiated only by the firing of the thyristor with a sufficiently high voltage at this capacitor.

BRIEF DESCRIPTION OF THE DRAWINGS

FIG. 1 is a block diagram of a proximity switch with a test and evaluation circuit according to the present invention.

FIG. 2 is the signal at different points of the evaluation circuit.

DETAILED DESCRIPTION

Figure 3:
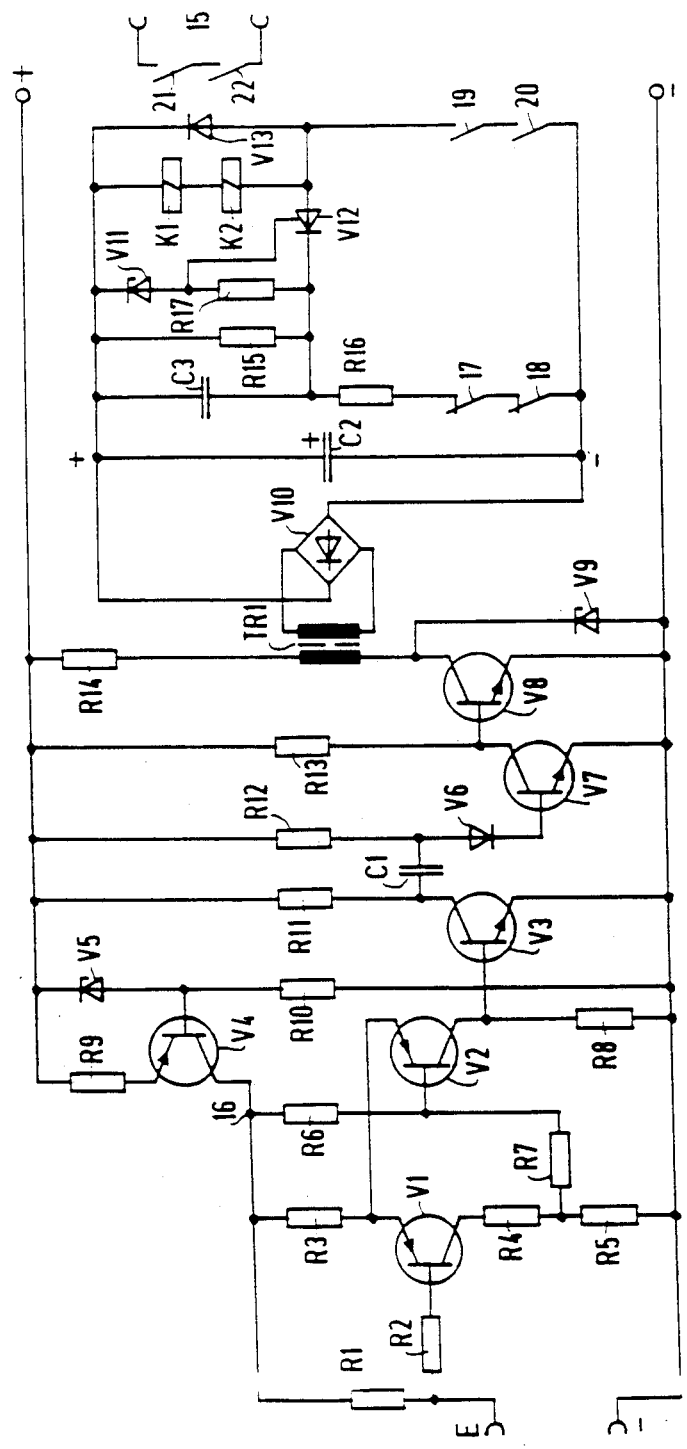
FIG. 3 is the evaluation circuit in detail.

FIG. 1 shows an oscillator 7 which is associated with an inductive proximity switch and is provided with two terminals which are connected to a test circuit 1 which contains a control circuit 4 with an input A and an output C, in series with a damping circuit 2 with an output D. The one terminal of the oscillator 7 is connected to the input A of the control circuit 4, and the other terminal is connected to the output D of the damping circuit 2. The control circuit 4 comprises an integrated switching circuit 5 which has the input A as its input and has an output B, to which a one-shot circuit 6 as well as a network 8 are connected. The one-shot circuit 6, comprising two series-connected one-shot multivibrators, has an output C which is at the same time an output of the control circuit 4 and to which the damping circuit 2 is connected. Besides its connection to the output B of the integrated switching circuit 5, the network 8 has two outputs which are, at the same time, the outputs of the control circuit 4 and the test circuit 1 and which are connected to two inputs of an evaluation circuit 3. In the evaluation circuit 3 there is a series circuit comprising a load 9, a Schmitt trigger 10, a protective circuit 11, an amplifier circuit 12, a transformer Tr, and a relay circuit 13 with two relays having contact 21 and 22 respectively, where the components are wired together in the order mentioned. The load 9 is connected to the first input E of the evaluation circuit 3. The second input of the evaluation circuit 3 is connected to the minus pole of a d-c voltage which is generated by a power supply 14 and supplies the evaluation circuit 3. The evaluation circuit 3 is coupled to the load circuit 15 of the proximity switch via the two normally open contacts 21 and 22 of the two relays of the relay circuit 13.

The oscillator 7 oscillates, in the undamped condition, i.e., when there is no external actuating element near it, to an amplitude which is present at the input A of the integrated switching circuit 5. This amplitude is larger than it is in the damped state when an actuation element approaches the proximity switch from the outside. Consequently, due to the full amplitude of oscillator 7, there is a change of state at the output B of the integrated circuit 5, i.e., it goes from a low to a high state. The change of state is passed on to the one-shot circuit 6 which passes the signal o via its output C. Because of the delay in the two stage one-shot circuit a certain period of time after the occurrence of the change of state, a signal to the damping circuit 2 appears at output C, which thereupon instantaneously damps the oscillator 7 for a fixed period of time. Due to the transition of the oscillator 7 into the damped state, in which the oscillator amplitude is small, the output B changes its state again. Only at the end of the damping period established by the one-shot circuit 6 is the damping by the damping circuit 2 cancelled, at which time the oscillator 7 again starts to oscillate without damping, whereby the cycle described above is repeated again. The duration of the damping given by the one-shot circuit 6 is matched to the duration of the oscillation build-up of the oscillator which results in a signal sequence according to FIG. 2 at the output B of the integrated circuit 5.

The output B is passed on to a network 8, at the output of which a periodic change of state is thereupon provided to the evaluation circuit 3 which exhibits a corresponding square wave voltage at the load 9. The connected Schmitt trigger 10 generates, even from a distorted square wave signal present on the input side, a square wave voltage of defined leVel which is amplified in the following amplifier circuit 12 and is thereupon fed to the transformer Tr. The a-c voltage, also present in this state on the secondary side of the transformer Tr, at the same time supplies and controls the relay circuit 13, the relays of which pull up to close contacts 21 and 22. The protective circuit 11 is connected between the Schmitt trigger 10 and the amplifier circuit 12. It protects the load 9 against overload in the event of a short circuit between the input terminals of the evaluation circuit 3.

The a-c voltage on the secondary side of the transformer Tr occurs only in a faultless state of the test circuit 1 and evaluation circuit 3 during testing, in which the proximity switch is not damped. A failure of this a-c voltage during the undamped state indicates a fault within the test circuit 1 and evaluation circuit 3. In response to such a failure, the proximity switch changes into the secure condition, in which the load circuit 15 to be controlled is open.

In contrast to the undamped condition described above, the oscillator 7 does not oscillate so strongly in the damped condition of the proximity switch, i.e., during the time an external element is being sensed in close proximity to the oscillator, and therefore does not cause a change of state at the output B of the integrated circuit 5. Instead, the output B is in a definite constant state for the duration of the damping. As a result, no square wave signal is formed in the evaluation circuit 3. In this case, no response current flows in the evaluation circuit 3, but only a small residual current. The lack of the square wave voltage in the evaluation circuit 3 for the duration of the damping, means that the relay circuit 13 does not respond and therefore, the load circuit 15 is likewise in the secure state, the same as when a fault is present. Thus, proximity is sensed and in response thereto the load 15 is disconnected from its source.

FIG. 3 shows the detailed evaluation circuit 3, with the first input E, to which the junction of resistors R1 and R2 are connected. Resistor R1 is the load resistor. The second input is connected to the minus pole of a d-c voltage supplied to the evaluation circuit 3. The d-c voltage is generated by the power supply 14 of FIG. 1. The signal at load resistor R1 is coupled to the Schmitt trigger 10 which comprises two transistors V1 and V2 and eight ohmic resistors R1 to R8. Both transistors V1 and V2 are arranged in an emitter circuit and are connected to each other via their emitter terminals which in turn, are connected via the resistor R3 to the junction point 16. The resistors R1 and R2 are connected to the input E, where the resistor R1 is connected with its other terminal to the junction point 16 and the resistor R2 is connected to the base of the transistor V1. The resistor R6 is connected between the junction point 16 and the base of the transistor V2, to which, in addition, the resistor R7 is connected. Between the collector of the transistor V1 and the minus pole the series-connected resistors R4 and R5 are connected, their junction point being connected to the resistor R7. The resistor R8 is connected between the collector of the 10 transistor V2 and the minus pole of the d-c voltage. The following protective circuit 11 includes a transistor V4 and a Zener diode V5 as well as two ohmic resistors R9 and R10. The collector of the transistor V4 is connected to the junction point 16. The resistor R10 is connected between the base of the transistor V4 and the minus pole. In addition, the Zener diode V5 is connected to the base of the transistor V4. The two other terminals of the resistor R9 and the Zener diode V5 are combined at the plus pole of the d-c voltage supplied to the evaluation circuit by the power supply 14. The subsequent amplifier circuit 12 is comprised of three transistors V3, V7 and V8 as well as a diode V6, a Zener diode V9, a capacitor C1 and four ohmic resistors R11, R12, R13 and R14. The base of the transistor V3 is connected to the collector of the transistor V2, while the emitter of the transistor V3 and also the emitter terminals of the transistors V7 and V8 are connected directly to the minus pole of the d-c voltage. The resistors R11, R12, R13 and R14 are connected to the plus pole of the d-c voltage. The collector of the transistor V3 is wired to the resistor R11 and to one terminal of the capacitor C1. The resistor R12 is connected via the diode V6 to the base of the transistor V7 and the collector of the transistor V7 is tied to the resistor R13 as well as to the base of the transistor V8. The other terminal of the capacitor C1 is connected to the junction point between the resistor R12 and the diode V6. The primary winding of the subsequent transformer Tr is connected between the collector of the transistor V8 and the one terminal of the resistor R14, the other terminal of which is connected to the plus pole of the d-c voltage. The Zener diode V9 is connected between the collector of the transistor V8 and the minus pole of the d-c voltage.

The square wave present between the input E of the evaluation circuit 3 and the minus pole of the d-c voltage is detected by the Schmitt trigger 10 as to its level. Even from a distorted square wave, a square wave signal of exactly defined level is generated which is present at the collector of the transistor V2 and is fed from there to the amplifier circuit 12. The interposed protective circuit 11 provides overload or short-circuit protection. It prevents an overload of the resistor R1 in the event of a terminal short circuit between the input E and the minus pole of the d-c voltage, since here the voltage at the resistor R9 increases and, consequently, the transistor V4 limits the current drain of the resistor R1 of the load 9. In the short circuit under consideration, the proximity switch changes to the secured state.

By means of the transistor V3, the level detected by the Schmitt trigger 10 is translated to the minus level. The capacitor C1 provides the output coupling for a square wave signal and passes it on to the subsequent amplifier stages with the transistors V7 and V8. By means of the capacitor C1, decoupling between the transistors V8 and V2 is performed, which serves as a protection of the transistor V8. By the decoupling through the capacitor C1, a permanent shorts of the transistor V8 due to a fault in a preceding circuit part is prevented. This measure is necessary in order to prevent a continuous flow of current through the transistor V8 which would destroy it.

The relay circuit 13 includes a rectifier bridge circuit V10 with a plus and a minus pole at its output, a Zener diode V11, a diode V13 and two relays K1 and K2 with forcibly guided contacts. Each relay has one set of normally closed contacts, contacts 17 and 18 respectively, and two sets of normally open contacts, contacts 19, 20, 21 and 22. The relay circuit 13 also has a smoothing capacitor C2 and a capacitor C3, three ohmic resistors R15, R16 and R17 as well as a thyristor V12. The rectifier bridge circuit V10 has its input connected to the secondary side of the preceding transformer Tr and its output connected, between its plus and minus poles, to the smoothing capacitor C2. Parallel to the smoothing capacitor C2 is connected a series circuit comprising capacitor C3, the resistor R16 and the two normally closed contacts 17, and 18 of the two relays K1 and K2. Parallel to the capacitor C3 are connected the resistor R15 as well as the series circuit formed by the Zener diode V11 and the resistor R17, where the cathode of the Zener diode V11 is likewise connected to the plus pole of the rectifier bridge circuit V10 as is the one terminal of the capacitor C3. The other terminal of the resistor R17 is connected to the other terminal of the capacitor C3, to which also the cathode of the thyristor V12 is connected. The base of the thyristor V12 is connected to the junction point between the Zener diode V11 and the resistor R17. The two series-connected coils of the relays K1 and K2 as well as the diode 13 are located between the anode of the thyristor V12 and the plus pole of the rectifier bridge circuit V10, to which the diode V13 is connected with its cathode. The two normally open contacts 19 and 20 are connected between the anode of diode V13 and the minus pole of the rectifier bridge circuit V10. The two other normally open contacts 21 and 22 of the relays K1 and K2 are connected into the load circuit 15.

In the faultless state of the test circuit 1 and evaluation circuit 3, an a-c voltage is present at the transformer Tr when the proximity switch is not damped. This voltage is rectified by the rectifier circuit V10 and is smoothed by the shunt-connected smoothing capacitor C2. With the charging of the smoothing capacitor C2, a current also flows through the normally closed contacts 17 and 18, whereby the capacitor C3 is charged simultaneously. As soon as the voltage at the capacitor C3 reaches the bend characteristic of the Zener diode V11, a voltage drop is generated across the resistor R17, at which time the thyristor V12 is fired. Due to the subsequent discharging of the capacitor C3 via the coils of the relays K1 and K2, the relays K1 and K2 pull up and go into the self-holding state via the contacts 19 and 20. Due to the closing of the contacts 19 and 20, the polarity of the thyristor V12 is reversed and it blocks.

The two relays K1 and K2 are designed with forcibly guided contacts. As a result a relay transfers the proximity switch into the secured state even for the case in which the relay contacts of the other relay stick, since repeated pulling up of the non-sticking relay is precluded by the interlocking with the corresponding interlocking contact 17 or 18 of one of the two relays K1 or K2. If, for instance, one of the normally open contacts of the two relays remains stuck, only one of the two relays K1 or K2 drops off. The normally open contact 19 or 20 of one of the two relays K1 or K2 remains closed, while the corresponding normally closed contact 17 or 18 of the relay K1 or K2 which is not sticking remains open. As a result, charging the capacitor C3 via the resistor R16 and the two normally closed contacts 17 and 18 is impossible even if a square wave is present during the following test procedures. This means that the proximity switch remains permanently in this state. The relay circuit 13 is secured also in the face of a short circuit via the thyristor V12 or by fusing of the same. In this case, current flows through the two relays and the series-connected resistor R16, at which, however, there is so high a voltage drop that the relays K1 and K2 can no longer pull up. In this process, the previously described starting circuit becomes ineffective with the drive of the thyristor V12.

What is claimed is:

1. A proximity switch comprising:
    (a) a test circuit having:
        (i) a control circuit for generating pulses at an output thereof;
        (ii) an oscillator having an output coupled as an input to said control circuit said oscillator adapted to be damped by an external element being brought into proximity therewith;
        (iii) a damping circuit for said oscillator having an input coupled to the output of said control circuit, and an output coupled to said oscillator; and
        (iv) said test circuit with the damping and the control circuit generating a pulse sequence required for active testing only when said proximity switch is not damped by an external element;
    (b) an evaluation circuit receiving an input from said test circuit said evaluation circuit carrying a response current only as long as the test circuit is actively testing in a faultless condition; and
    (c) a relay circuit coupled to the output of said evaluation circuit.

2. The proximity switch claimed in claim 1, wherein the control circuit comprises:
    (a) an integrated switching circuit having its input coupled to said oscillator; and
    (b) a one-shot circuit including two series-connected one-shot multivibrators, said one-shot circuit having its input coupled to the output of said integrated switching circuit and providing its output to said damping circuit; and further including:
    (c) a network coupling the junction between said integrated switching circuit and said one-shot circuit.

3. The proximity switch as claimed in claim 2, and further including a power supply supplying d-c voltage to said evaluation circuit and wherein said network has two outputs and said evaluation circuit includes a load and two input terminals which are coupled to said two outputs of said network, a first terminal being coupled to said load and a second terminal to the minus pole of the d-c voltage which is generated by said power supply.

4. The proximity switch claimed in claim 3, and further including a load circuit for said proximity switch and wherein said evaluation circuit further includes:
    (a) a Schmitt trigger, having an input coupled to said load of said evaluation circuit and an output;
    (b) a protective circuit against shorts having an input coupled to said Schmitt trigger and an output;
    (c) an amplifier circuit having an input coupled to the output of said protective circuit and an output;
    (d) a transformer having a primary coupled to the output of said amplifier and a secondary, said relay circuit having its input coupled to said transformer secondary and an output coupled to said load circuit for said proximity switch whereby said load circuit is thereby controlled by the proximity switch via an output of said evaluation circuit.

5. The proximity switch as claimed in claim 4, wherein the relay circuit comprises:
   (a) first and second relays each having a coil and forcibly guided contacts including a set of normally closed contacts and two sets of normally open contacts;
   (b) a rectifier bridge circuit having a plus and a minus pole at its output and having an input coupled to the secondary of said transformer;
   (c) a smoothing capacitor coupled across the output between the plus and the minus poles of said bridge circuit;
   (d) a series circuit comprising a second capacitor, a first ohmic resistor and the normally closed contacts of said first and second relays coupled across said smoothing capacitor;
   (e) a second ohmic resistor in parallel with said second capacitor;
   (f) a series circuit comprising a Zener diode and a third ohmic resistor coupled in parallel with said second resistor, the cathode of the Zener diode being coupled to the plus pole of the rectifier circuit output;
   (g) a thyristor having an anode, a cathode and a control electrode, the junction point between the Zener diode and the third ohmic resistor being coupled to the control electrode of said thyristor, the cathode of said thyristor being coupled to the junction between said second capacitor and first resistor;
   (h) the coils of said first and second relays coupled in series between the plus pole and the anode of said thyristor; and
   (i) a diode shunted across said relay coils having its cathode coupled to the plus pole, one set of normally open contacts from each of said first and second relays coupled in series between the anode of said diode and the minus pole, and the other two sets of normally open contacts coupled into said load circuit of said proximity switch.

* * * * *